United States Patent [19]
Hoff et al.

[11] Patent Number: 5,966,036
[45] Date of Patent: Oct. 12, 1999

[54] SYSTEM AND METHOD FOR A MIXED VOLTAGE DRIVE SYSTEM FOR FLOATING SUBSTRATE TECHNOLOGY

[75] Inventors: David L. Hoff, San Jose; Frederick S. Chiu, San Francisco, both of Calif.

[73] Assignee: S3 Incorporated, Santa Clara, Calif.

[21] Appl. No.: 08/926,174

[22] Filed: Sep. 9, 1997

[51] Int. Cl.[6] .................................................. H03B 1/00
[52] U.S. Cl. .......................................... 327/112; 326/87
[58] Field of Search .................................. 326/85, 87, 88, 326/91, 92; 327/108, 109, 110, 111, 112, 536

[56] References Cited

U.S. PATENT DOCUMENTS

| | | | |
|---|---|---|---|
| 5,365,118 | 11/1994 | Wilcox | 327/109 |
| 5,537,060 | 7/1996 | Baek | 326/87 |
| 5,680,071 | 10/1997 | Senoh et al. | 327/390 |
| 5,783,948 | 7/1998 | Thomann et al. | 326/88 |
| 5,801,569 | 9/1998 | Pinkham | 327/536 |

*Primary Examiner*—Timothy P. Callahan
*Assistant Examiner*—Jeffrey Zweizig
*Attorney, Agent, or Firm*—Fenwick & West LLP

[57] ABSTRACT

A system for buffering input and output signals in a floating substrate technology environment comprises an output pre-driver and an output driver. The output pre-driver includes a pull-up subsystem and a pull-down subsystem, which both receive an output signal and an output enable signal. The pull-up subsystem includes a multistage delay circuit, a current regulation circuit, and a bootstrap circuit, a keeper circuit, an oscillator circuit, and a turn-off circuit, which are coupled together so that a pull-up signal is generated. The pull-down subsystem includes a stagger circuit and a switch circuit that are coupled together to generate a pull-down signal. The output driver includes a pull-up circuit to receive the pull-up signal and a staggered pull-down circuit to receive the pull-down signal. The output driver generates a pad signal used to drive a peripheral device that is coupled to the mixed voltage drive system. A method for a mixed voltage drive system for floating substrate technology is also disclosed.

30 Claims, 8 Drawing Sheets

SYSTEM AND METHOD FOR A MIXED VOLTAGE DRIVE SYSTEM FOR FLOATING SUBSTRATE TECHNOLOGY

BACKGROUND OF THE INVENTION

1. Field of the Invention

The present invention relates to mixed voltage drive systems for floating substrate technology environments, and more specifically for input/output ("I/O") buffer circuits.

2. Description of the Related Art

Input and output devices in data systems typically pass signals between each other. Oftentimes these devices have different voltage and current requirements and, therefore, their operation may be impaired if they are connected directly to one another. Direct connections may also cause signal miscommunication because the signal lines between devices can only carry the signals of one device at a time.

An I/O buffer is a circuit that, when enabled, passes digital signals between its device and one or more other devices, and, when disabled, isolates its device from the voltage and current loads of the other devices. Buffers may be selectively enabled and disabled and their corresponding devices may be granted or denied access to the signal lines interconnecting the devices. This allows for a protocol in which one device accesses the signal lines through its enabled set of buffers, while other devices are isolated by disabled buffers.

In a configuration having a first device and a second device such as a peripheral component, signals are often passed between each other. The two devices may operate at different voltages if they are directly connected one or both may be damaged or impaired. The two devices are protected, however, if they are coupled together by an I/O buffer circuit which isolates each device from the other's operating voltage and current.

A mixed voltage I/O buffer circuit performs all of the functions of the standard buffer described above and converts input signals of one voltage into logically equivalent output signals of another voltage. This is useful in passing signals between devices with distinct voltage thresholds. For example, a device may output signals at a maximum of 3.3 volts, while a peripheral component may require a minimum input voltage of 5.0 volts. Likewise, the peripheral component may output signals at a maximum of 5.0 volts, but the device may operate best with signals at 3.3 volts. A mixed voltage I/O buffer circuit placed between the two devices isolates each from the other's operating voltage and converts the 3.3 volts signal stream to a logically equivalent 5.0 volts signal stream and vice versa.

Conventional buffer circuits, however, suffer from several performance problems when used in floating substrate technology environments such as dynamic random access memories ("DRAMs"), for example. When mounted on a microchip, the negatively biased substrate of the DRAM preferably acts as a substrate for all other devices mounted on the microchip, including any I/O buffers.

If, however, a p-channel pull-up transistor was to be mounted on the microchip, the n-material substrate cannot be directly connected to the pull-up voltage as in the conventional circuit. This is because a direct connection between the negatively biased substrate and the positive pull-up voltage will result in a current flow into the DRAM substrate. If, however, the negatively biased substrate of the DRAM functions as the substrate of the pull-up transistor, a sufficiently positive voltage on a drain of the pull-up transistor will forward bias the PN junction between the drain and the substrate. The forward bias will breach the junction and create a current flow into the negatively biased substrate that would continue to increase to the extent that would lead to the destruction of the integrated circuit.

Another performance problem of a conventional buffer circuit is the amount of ground noise that may be generated by a sudden pull-down of the n-channel transistor when the transistor is placed in an ON state. Typically, the amount of noise produced is proportional to the rate at which the pull-down is performed. When the N-channel transistor is suddenly pulled down, there is a large amount of noise that is generated that, in turn, disrupts any process occurring with the DRAM. For example, a large amount of noise may disrupt a DRAM process when the transient current disturbs the negative bias on the substrate which may lead to voltage reversal and subsequent data destruction.

Therefore, there is a need for a system and a method for a mixed voltage drive system, including a buffer I/O system, for a floating substrate technology environment without leaking current into a negatively biased substrate and without producing excessive ground noise so that the I/O operation will not disrupt the operation of other portions of the integrated circuit.

SUMMARY OF THE INVENTION

The present invention is a system and a method for driving a computer memory or other peripheral device coupled to a mixed voltage drive system for floating substrate technology, including an input/output ("I/O") buffer system, without leaking current into a negatively biased substrate and without producing excessive ground noise.

The system comprises an output pre-driver, including an I/O buffer, coupled to an output driver. The output pre-driver comprises an n-channel pull-up subsystem and a staggered pull-down subsystem. The n-channel pull-up subsystem reduces the current paths that are caused by p-channels in other circuits. The staggered pull-down subsystem reduces the ground noise within the buffering system.

The pull-up subsystem of the output pre-driver comprises a multistage delay circuit, a current regulation circuit, a bootstrap circuit, an oscillator circuit, a keeper circuit, and a turn-off circuit. The multistage delay circuit is coupled to the current regulation circuit, the bootstrap circuit, and the turn-off circuit. The current regulation circuit is coupled to the bootstrap circuit. The bootstrap circuit is coupled to the keeper circuit and the output. The turn-off circuit is also coupled to the output. The oscillator circuit is coupled to the keeper circuit.

The multistage delay circuit receives an output signal and an output enable signal, that originates from the internal control logic of the microchip, and is used to generate a control signal. The current associated with the control signal is limited by the current regulation circuit to prevent high current flow in the pull-up subsystem. The control signal is provided to the bootstrap circuit to generate a pull-up signal. The keeper circuit, which includes a clock regulated by the oscillator circuit, maintains a voltage level set by the bootstrap circuit and used to generate the pull-up signal. The pull-up signal is provided to the output driver.

The pull-down subsystem of the output pre-driver comprises a stagger circuit and a switch circuit. The stagger circuit and switch circuit are coupled together and coupled to the output driver. The stagger circuit and the switch circuit also receive the output signal and the output enable signals. The switch circuit allows for the quick switch off of the stagger circuit once the stagger circuit generates a pull-down signal that is provided to the output driver.

The output driver comprises an output driver pull-up stagger subcircuit and an output driver pull-down circuit. The pull-up stagger subcircuit is at least one pull-up transistor with a source, a gate, a drain, and a substrate. In a preferred embodiment the pull-up transistors are comprised of n-channel transistors. A source voltage greater than or equal to the pull-up voltage is tied to the drain of a pull-up transistor, while the substrate is fashioned out of a negatively biased substrate.

As each rising edge of the input signal is detected by a pull-up pre-driver circuit, a pull-up signal is generated. This signal is relayed to the gate of the pull-up transistor, and raises the gate to source voltage. The output signal is pulled-up to the pull-up voltage, which is the voltage level that the peripheral device requires, or operates, at. With each falling edge of the input signal, the pull-up signal is lowered and the gate to source voltage of the transistor falls. This depletes the n-channel and the transistor turns off. However, because the negatively biased substrate of the transistor is made of n-type material, high voltages on the output interface will negatively bias the PN junction between the drain and substrate thereby preventing the current leakage.

The pull-down stagger circuit is one or more pull-down transistors, each with a source, a gate, a drain, and a substrate, that are cascaded together. In a preferred embodiment the pull-down transistors are comprised of n-channel transistors. A sink voltage of less than or equal to the pull-down voltage is tied to the source of each pull-down transistor. As each falling edge of the input signal is detected by a pull-down pre-driver, a pull-down signal is generated. This signal is relayed sequentially to the gates of the pull-down transistors. As the pull-down signal raises their gate to source voltages, the pull-down transistors turn on in order. As each transistor turns on, the output resistance of the buffer is reduced, gradually pulling the output signal down to the voltage level desired or required by the peripheral device, for example 3.3 volts.

In one embodiment the pull-down stagger circuit consists of six transistors and pulls an output signal down from the pull-up voltage to the pull-down voltage in the following sequence: 90% of pull-up, followed by 80%, 70%, 60%, 50% of pull-up, for example, and then pull-down. In an alternative embodiment, the circuit may be staggered as varying percentages that are set by various engineering factors. Since the output is pulled down in a staggered fashion, the ground noise generated is far less than that generated by the single transistor of the conventional design. This is because the staggered transistors do not produce the sudden current flow across the buffer's output as does the conventional design.

The signal that is generated by the output driver is a pad signal that is used to drive some peripheral device coupled to the mixed voltage drive system. For example, the pad signal may be at 5.0 volts if it is pulled up from a 3.3 volt signal or the pad signal may be at 3.3 volts if it is pulled down from a 5.0 volt signal. Regardless of whether the pad signal is a pulled up or pulled down from the output voltage level, there is a significant reduction in associated noise and, therefore, there is a significant increase in system performance.

The present invention advantageously provides a mixed voltage drive system that provides a high performance drive signal with low noise using only n-channel devices. Moreover, the present invention works with mixed voltage environment allowing greater system flexibility without compromising system performance. Both the n-channel pull-up and the staggered pull-down reduce noise within the system and circuit of the present invention. In addition, when the system is coupled with an output driver having a staggered pull-down or pull-up circuit there is a further reduction in noise that provides a quieter environment. A quieter environment allows the system and circuit to operate with increased performance because there are fewer delays associated with noise dissipation within the system and circuit.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF THE PREFERRED EMBODIMENTS

Figure 1:
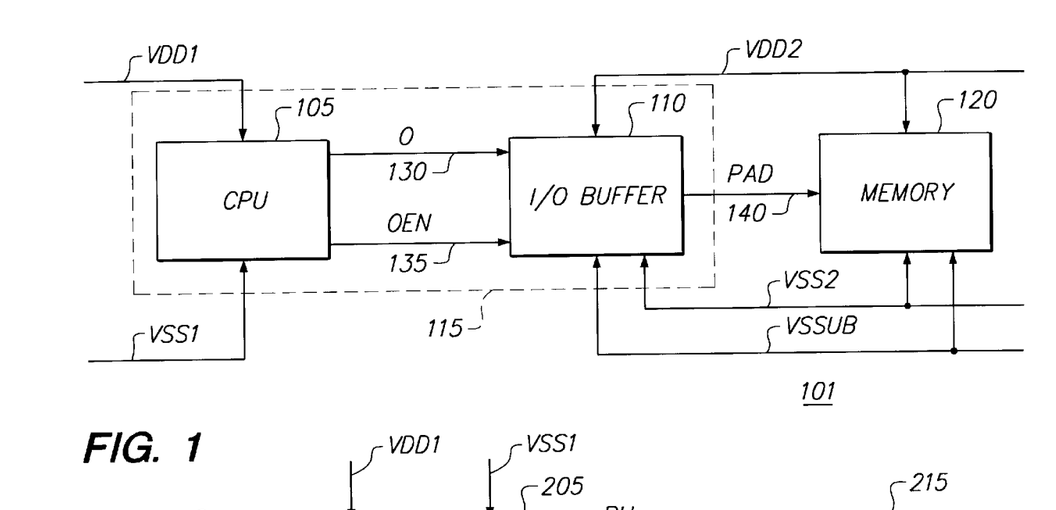
FIG. 1 is a block diagram of a mixed voltage drive system in accordance with the present invention.

FIG. 1 is a block diagram of a mixed voltage drive system 101 in accordance with the present invention. The mixed voltage drive system 101 comprises a controller unit 115 that includes a processor unit 105 and an output pre-driver subsystem such as an input/output ("I/O") buffer system 110, a memory 120, an output signal line 130, an output enable signal line 135, a pad signal line 140, a first drain voltage line VDD1, a first source voltage line VSS1, a second drain voltage line VDD2, a second source voltage line VSS2, and a substrate voltage line VSSUB.

The controller unit 115 is coupled through the pad signal line 140 to the memory 120, a negatively biased substrate, or some other peripheral device requiring a high-drive low-noise signal. Further, within the controller unit 115 the processor 105 is coupled to the I/O buffer 110 though the output signal line 130 and the output enable signal line 135.

The pad signal line 140 is coupled to the I/O buffer 115. In addition, the first drain voltage line VDD1 and the first source voltage line VSS1 are coupled to the controller unit 115, and more specifically, the processor 105. The second drain voltage line VDD2 and the second source voltage line VSS2 are coupled to the controller unit 115, more specifically the I/O buffer 110, as well as the memory 120. The substrate voltage line VSSUB is also coupled to the I/O buffer 110 and the memory 120. It is noted that in one embodiment VDD1 and VDD2 may be full-rail supply voltages, for example 3.3 volts or 5.0 volts, and VSS1 and VSS2 may be tied to ground.

During operation of the mixed voltage drive system 101, the processor 105 generates an output signal along the output signal line 130 that is either a logic high, "1", or a logic low, "0", level signal. It is noted that a logic high signal may be a 5.0 volt signal, for example, and a logic low signal may be a 0 volt signal, for example. Depending on whether the signal is a logic high or a logic low, the I/O buffer generates a pad signal along the pad signal line 140 that is the respective low noise version of the output signal that is desired or required to drive the peripheral device, such as the memory 120. It is noted that the I/O buffer 110 is enabled when the output enable signal along the output enable signal line 135 is a logic low and is disabled when the output enable signal along the output enable signal line 135 is a logic high.

Figure 2:
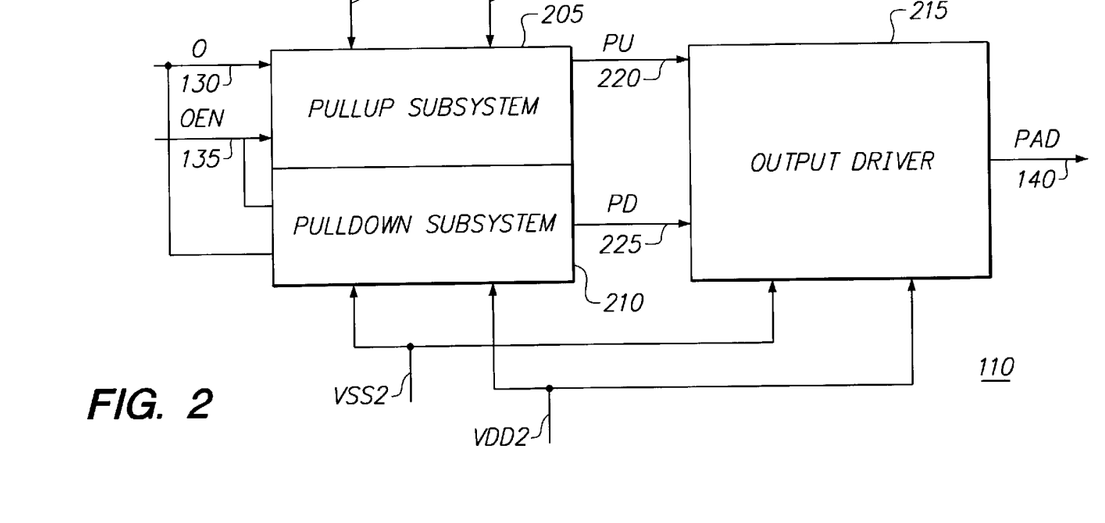
FIG. 2 is a block diagram of an input/output ("I/O") buffer system in accordance with the present invention.

FIG. 2 is a block diagram of an output pre-driver, or an I/O buffer 110, in accordance with the present invention. The I/O buffer 110 includes a pull-up subsystem 205, a pull-down subsystem 210, an output driver 215, a pull-up signal line 220, and a pull-down signal line 225. The output signal line 130 and the output enable signal line 135 are both coupled to the pull-up subsystem 205 and the pull-down subsystem 210. The pull-up subsystem 205 is coupled to the output driver 215 through the pull-up signal line 220 and the pull-down subsystem 210 is coupled to the output driver 215 through the pull-down signal line 225. The output driver 215 is coupled to the pad signal line 140 to provide the output from the I/O buffer 110.

When an output signal from the processor 105 is received along the output enable line 130, only one of the pull-up subsystem 205 or the pull-down subsystem 210 is active. Specifically, if the output signal is a logic high, the pull-up subsystem 205 is active and a pull-up signal is generated and forwarded to the output driver 215. If the output signal is a logic low, the pull-down subsystem 210 is active and the pull-down signal is generated and forwarded to the output driver 215 along the pull-down signal line 225. As will be further discussed below, having only one of the pull-up subsystem 205 or the pull-down subsystem 210 operational at one time beneficially provides a low-noise signal to the output driver 215 which in turn, generates a low-noise pad signal to drive a peripheral device.

Figure 3:
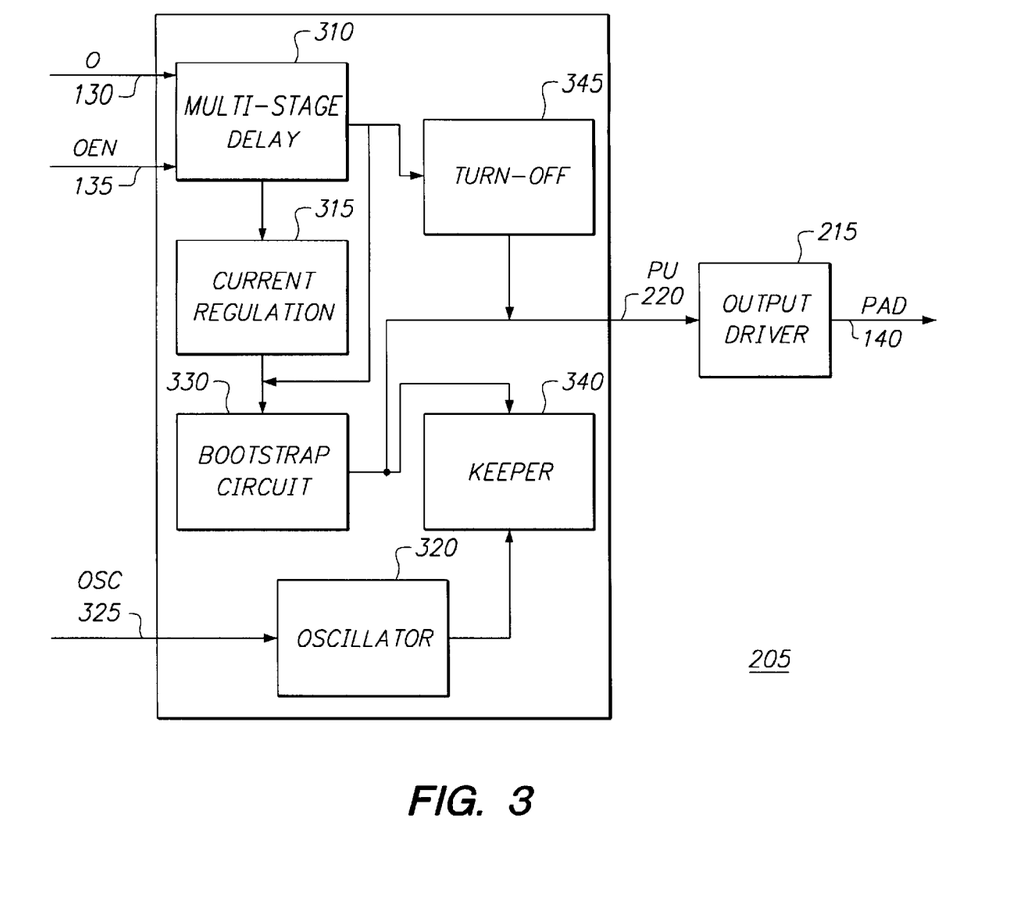
FIG. 3 is a block diagram of a pull-up subsystem of an I/O buffer in accordance with the present invention.

FIG. 3 is a block diagram of a pull-up subsystem 205 of the I/O buffer 110 in accordance with the present invention. The pull-up subsystem 205 includes a multistage delay circuit 310, a current regulation circuit 315, an oscillator circuit 320, an oscillator circuit signal line 325, a bootstrap circuit 330, a keeper circuit 340, and a turn-off circuit 345.

The multistage delay circuit 310 is coupled to the output line 130 and the output enable line 135. The multistage delay circuit 310 is also coupled to the current regulation circuit 315, the bootstrap circuit 330, and the turn-off circuit 345. The current regulation circuit 315 is coupled to the bootstrap circuit 330. The bootstrap circuit 330 is coupled to the keeper circuit 340. The bootstrap circuit 330 is also coupled to the output driver 215 via the pull-up ("PU") signal line 220. The oscillator line 325 is coupled to the oscillator 320 that, in turn, is coupled to the keeper circuit 340.

The pull-up subsystem 205 is active when the output signal output signal line 130 is a logic high and the output enable signal along the output enable signal line 135 is a logic low. The output signal is received by the multistage delay circuit 310 which spaces the output signal to control the output signal through the pull-up subsystem 205. The spaced output signal is a control signal. The multistage delay circuit 310 supplies the control signal to the bootstrap circuit 330.

The current regulation circuit 315 limits the current of the control signal to prevent latch-up within the pull-up subsystem 205 which may result from a high current flow. The bootstrap circuit 330 receives the control signal and generates a greater than power supply voltage along the pull-up signal line 220 that is supplied to the output driver 215. For example, with a power supply of 5.0 volts, the bootstrap circuit 330 generates a voltage of about 2.0 volts (2.0 V_th) so that the signal along the pull-up signal line 220 is about 5.0 volts or about 7.0 volts.

The keeper circuit 340 maintains the voltage level that is set by the bootstrap circuit 330. For example, if the voltage level is set at 2 volts above a 5.0 volt power supply, the keeper circuit 340 ensures that the voltage level along the pull-up signal line is maintained at substantially 7.0 volts. The oscillator circuit 320 receives a system clock signal from along the oscillator signal line 325 and provides regular clock signals to the keeper circuit 340. The turn-off circuit 345 controls turning off the pull-up subsystem 205.

The pull-up subsystem 205 beneficially provides a greater than power supply voltage signal to the output driver 215. Moreover, this voltage signal beneficially is a low noise signal. A source follower is lower noise than a pull-down driver transistor. Further, a greater power supply voltage results in a full rail output, i.e., a voltage of 3.3 volts or 5.0 volts, for example, that will minimize direct current ("DC") power consumption in a memory microchip while increasing the microchip speed. Moreover, as further discussed below, the greater than power supply voltage signal is used to generate a pad signal having even less noise so that a peripheral device can be driven with increased performance.

Figure 4:
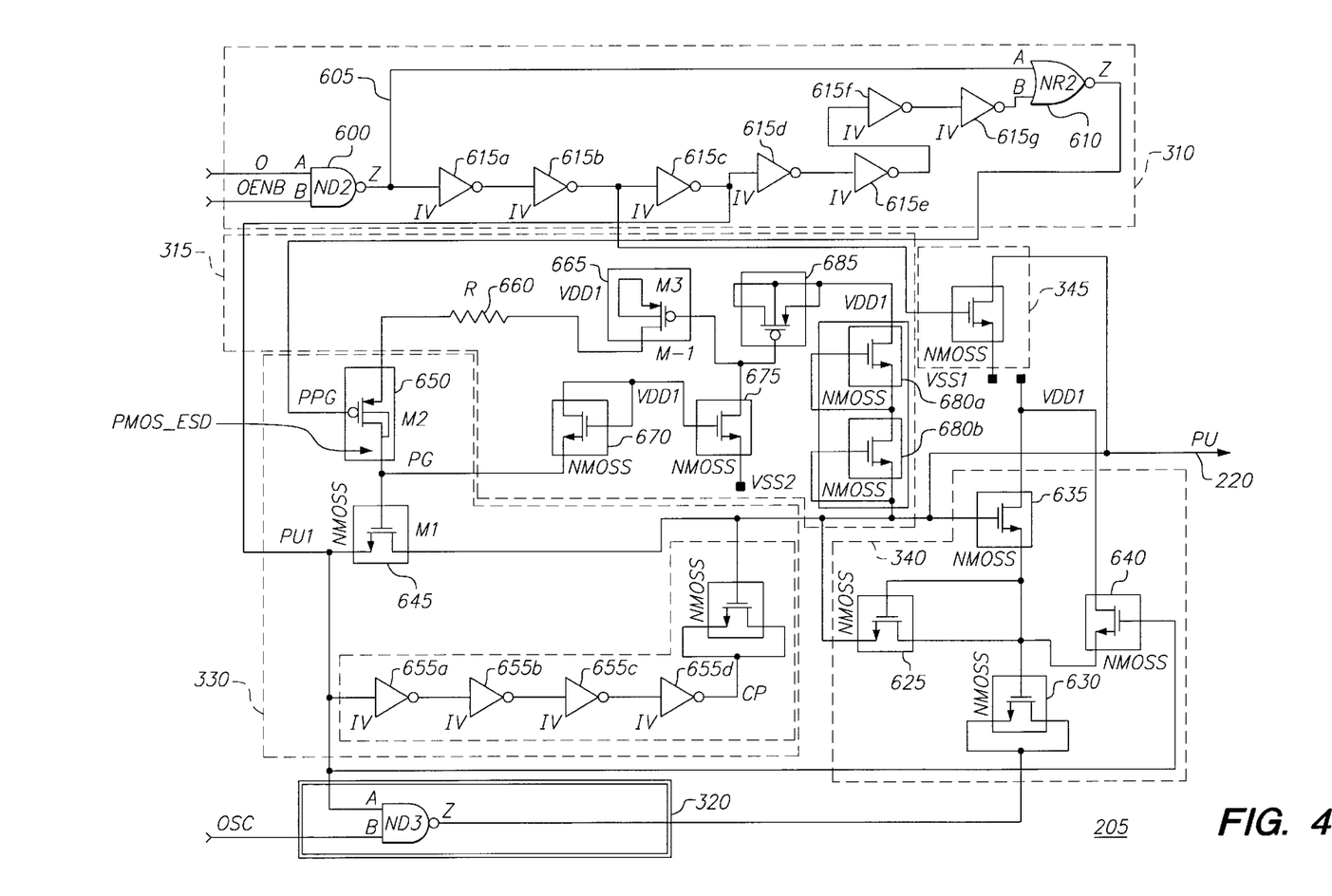
FIG. 4 is a circuit diagram of the pull-up subsystem of an I/O buffer in accordance with the present invention.

FIG. 4 is a circuit diagram of the pull-up subsystem 205 of an I/O buffer 110 in accordance with the present embodiment. The circuit diagram illustrates the circuit component described above in FIG. 3. Specifically, the multistage delay circuit 310 includes a NAND element 600 coupled to a NOR element 610 and a coupled series of inverter elements 615a–615g that are also coupled to the NOR element 610. The series of inverter elements 615a–615g serve as delay units that generate the spaced output signal, ie., control signal, for the current regulation circuit 315 and the bootstrap circuit 330.

The current regulation circuit 315 includes a start-up transistor 670, a noise filter capacitor 685, a reliability clamp subcircuit 680a, 680b, a damping transistor 665, and a damping resistor 660. The start-up transistor 670 is coupled to a noise filter capacitor 685. The noise filter capacitor 685 is coupled to the damping transistor 665 and the reliability clamp subcircuit 680a, 680b. The damping transistor 665 is coupled to the damping resistor 660. The damping resistor 660 and the start-up transistor 670 are coupled to the bootstrap circuit 330.

When the pull-up subsystem 205 is operational, the start-up transistor 670 of the current regulation circuit 315 ensures that a PG node is at a voltage of substantially VDD1. The damping resistor 660 and the damping transistor 665 operate to generate a regulated current that drives the bootstrap circuit. The noise filter capacitor 685 is part of the damping transistor 665 circuit and allows for a damping operation. The reliability clamp subcircuit 680a, 680b limits the voltage on the pull-up signal to allow for obtaining processing reliability requirements as may be set by microchip manufactures.

The bootstrap circuit 330 includes a precharge element 650, a passgate 645, and a series of inverters 655a–655d. The precharge element 650 includes transistor having a drain, a gate, and a source, where the gate is coupled to receive the spaced output signal from the multistage delay circuit 310 at a node PPG, the drain is coupled to receive the regulated current from the current regulation circuit 315, and the source is coupled to both the current regulation circuit 315 and the passgate 645 at node PG. The passgate 645 also includes a transistor having a gate, a drain, and a source. The gate of the passgate 645 is coupled to the source of the recharge element 650 at node PG. The source is coupled to the first inverter element 655 a of the series of inverter elements 655a–655d. The drain of the passgate 645 is coupled to the pull-up signal line 220. The inverter elements 645 are also coupled to the pull-up signal line 220.

The precharge element 650 of the bootstrap circuit 330 charges the PG node to the power supply level and then shuts off thereby precharging the bootstrap circuit 330. The passgate 645 transfers a full power supply level voltage to the pull-up signal line 220 so that the pull-up subsystem provides a greater than power supply voltage to the output driver 215 as discussed above in FIG. 2. The series of inverter elements 655a–655d create a delay. The delay allows a PU node to charge up partially before the bootstrap circuit 330 charges the node up beyond the full range voltage to about 5.0 or about 7.0 volts, for example.

Figure 5:
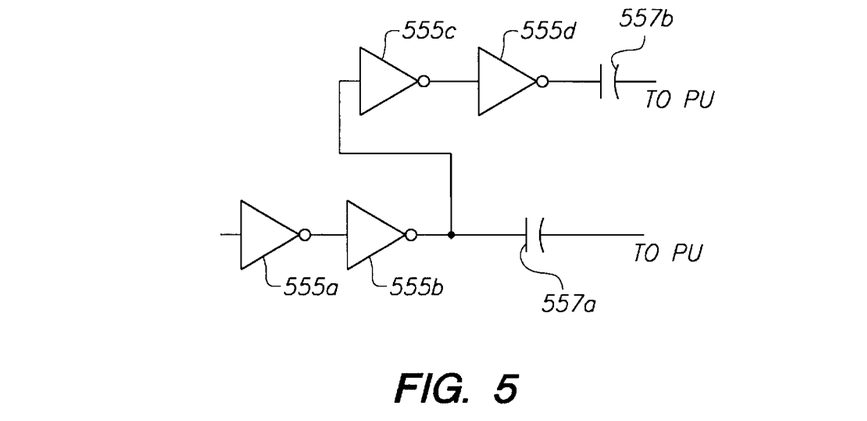
FIG. 5 is a circuit diagram of a resistor-capacitor delay group in accordance with the present invention.

It is noted that FIG. 5 illustrates another embodiment for the series of inverter elements 655a–655d in the bootstrap circuit 330. The alternative embodiment includes first and second inverters 555a, 555b coupled to each other and third and fourth inverters 555c, 555d that also are coupled to each other. In addition, the second inverter 555b is coupled to a capacitor 557a while the fourth inverter 555d is coupled to another capacitor 557b, and both capacitors 557a, 557b are coupled to the pull-up signal line 220.

Turning back to FIG. 4, the keeper circuit 340 includes a diode element 625, a capacitor element 630, a source element 635, and a start-up transistor 640, that are all coupled together. Moreover, the capacitor element 630 is coupled to the oscillator circuit 320 to receive the regular clock signals for the keeper circuit 340. The source element 635 of the keeper circuit 340 includes a transistor having a gate, a drain, and a source. The gate of the transistor of the source element is tied to the pull-up signal line, while the drain is tied to VDD. As noted above in FIG. 3, the keeper circuit maintains the voltage level along the pull-up signal line 220 as set by the bootstrap circuit 330.

Figure 6:
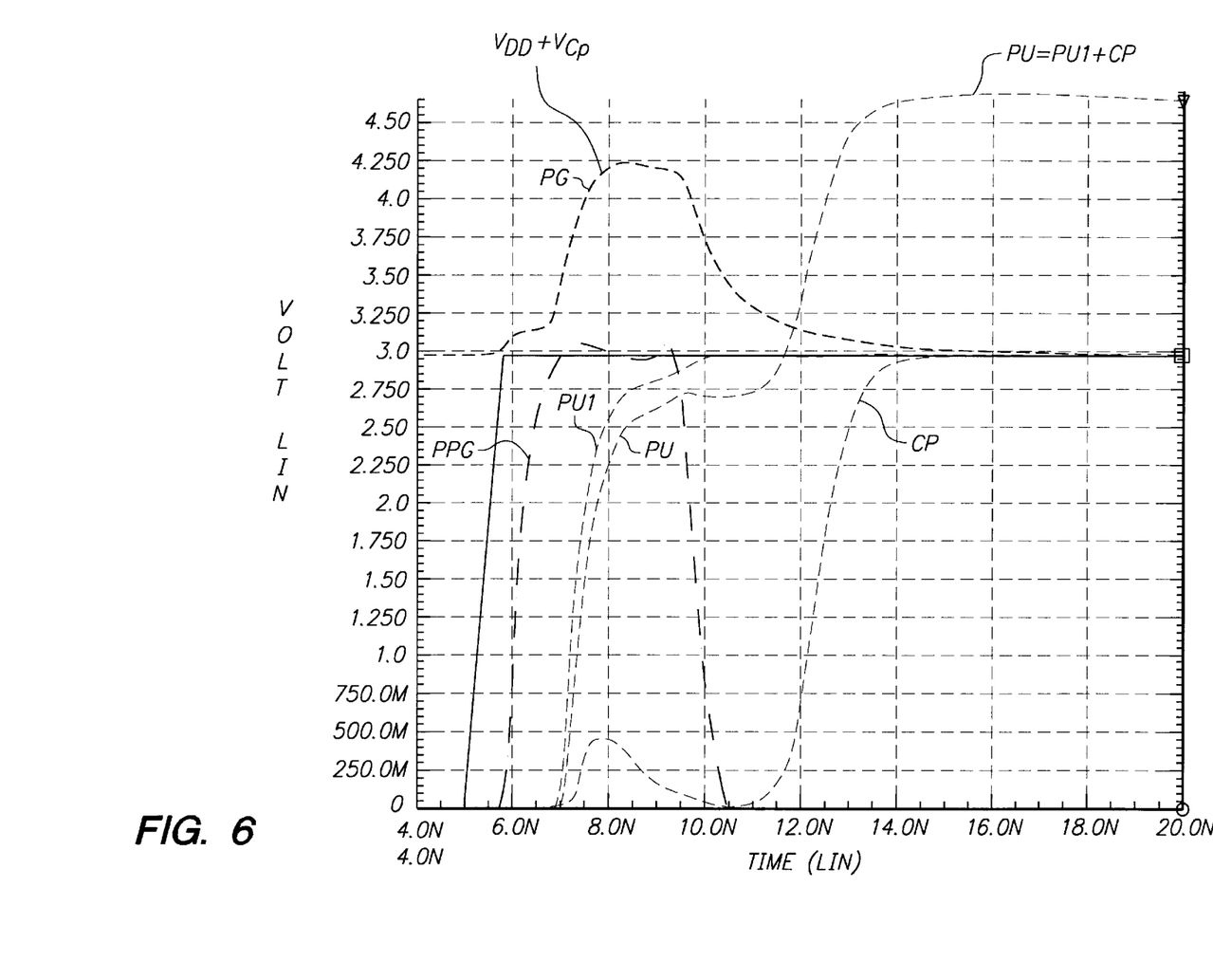
FIG. 6 is a timing diagram for pull-up signals from the pull-up subsystem for the I/O buffer in accordance with the present invention.

FIG. 6 illustrates a timing diagram for various nodes in the pull-up subsystem 205 of the I/O buffer 110 in accordance with the present invention. If the power supply voltage is 3.0 volts, the voltage at node PG is shown to rise above 4.2 volts before leveling off at 3.0 volts, while the voltage at node CP remains close to 0 volts before rapidly approaching and leveling off at about 3.0 volts. At about the time where both the PG node and the CP node approach 3.0 volts, the voltage along the pull-up signal line 220, shown as the PU node, jumps to a greater than voltage supply level of about 4.5 volts.

The pull-up subsystem 205 provides a greater than power supply voltage to the output driver 215 that advantageously is a low noise signal. Moreover, as further discussed below, the greater than power supply voltage is used to generate a pad signal having even less noise to drive a peripheral device thereby increasing overall system performance.

Figure 7:
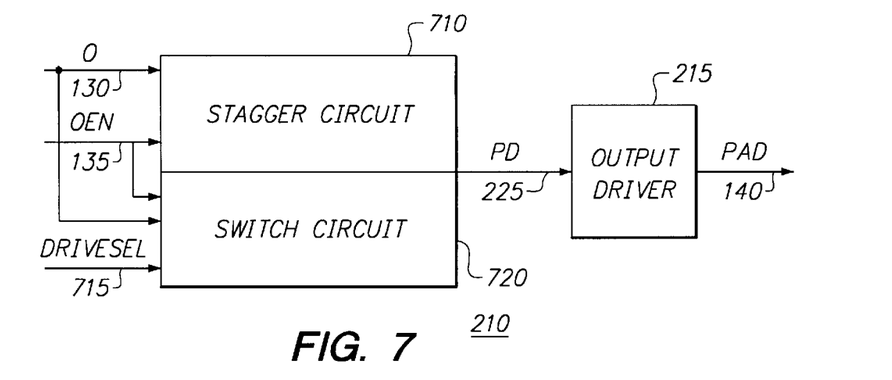
FIG. 7 is a block diagram of a pull-down subsystem of the I/O buffer in accordance with the present invention.

FIG. 7 is a block diagram of a pull-down subsystem 210 of the I/O buffer 110 in accordance with the present invention. The pull-down subsystem 210 includes a stagger circuit 710 and a switch circuit 720. Both the output signal line 130 and the output enable signal line 135 are coupled to both the stagger circuit 710 and the switch circuit 720. Both the stagger circuit 710 and the switch circuit 720 may include one or more pull-down signal sub-line that together may comprise the pull-down signal line 225 that is coupled to the output driver 215. The stagger circuit 710 provides staggered pull-down signals to the output driver 215. The switch current 720 functions to rapidly turn off the stagger circuit 710, for example when the pull-up subsystem 210 begins operation.

Figure 8:
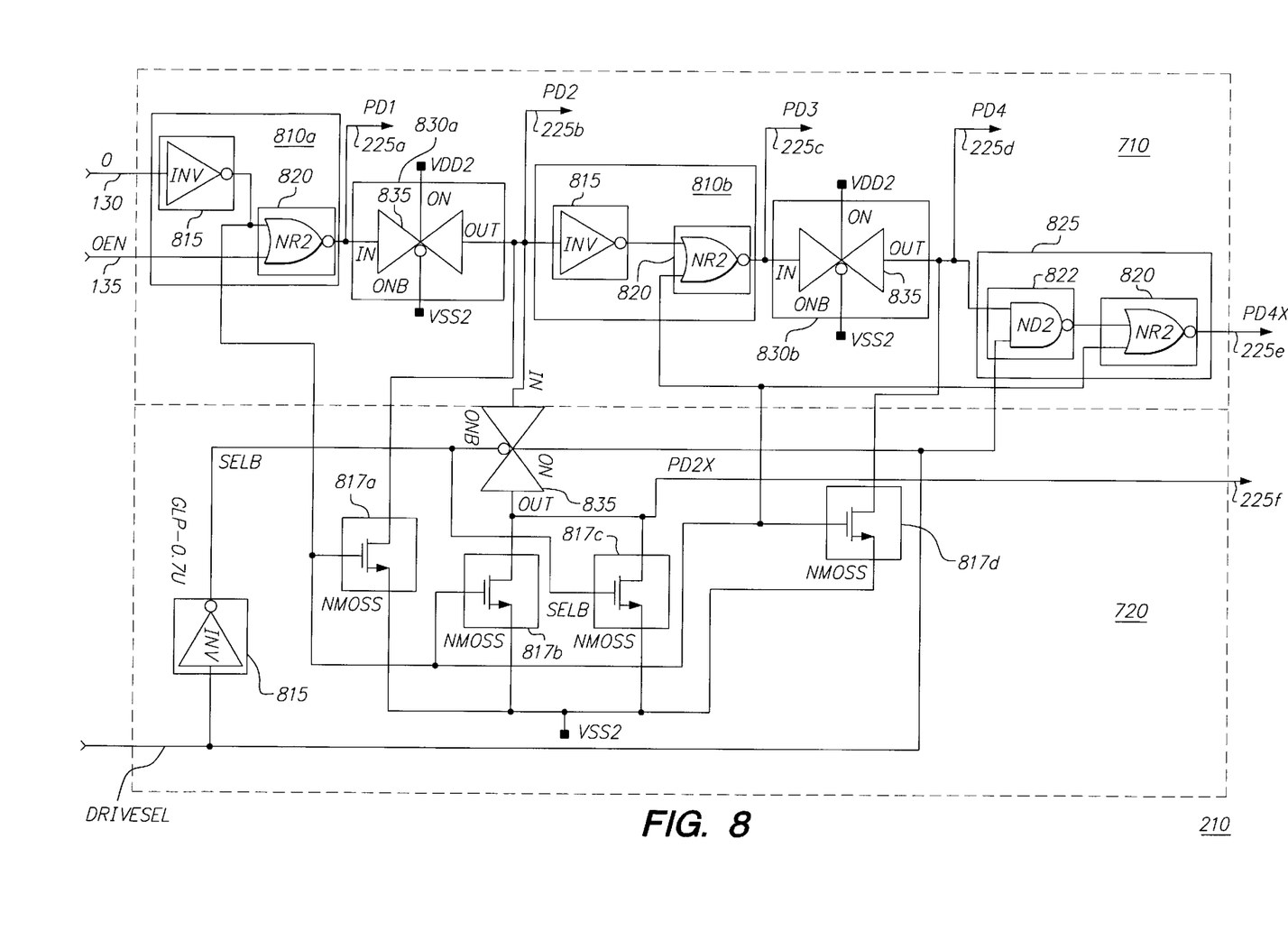
FIG. 8 is a circuit diagram of the pull-down subsystem of the I/O buffer in accordance with the present invention.

FIG. 8 is a circuit diagram of the pull-down subsystem 210 of the I/O buffer 110 in accordance with the present invention. Specifically, the stagger circuit 710 includes inverter delay elements 810, passgate delay elements 830, a NAND/NOR delay element 825, and pull-down signal sub-lines 225a–225e. The inverter delay elements 810 include an inverter 815 and a NOR gate 820 where the output of the inverter 815 is coupled to a first input of the NOR gate 820.

A first inverter delay element 810a is coupled to the output signal line 130 and the output enable line 135. Specifically, the output signal line 130 is coupled to an input of the inverter 815 and the output enable signal line 135 is coupled to a second input of the NOR gate 820. The output of the NOR gate 820 is the output of the first inverter delay element 810a. The output of the first inverter delay element 810a is coupled to a first pull-down signal sub-line 225a and a first passgate delay element 830a.

The output of the first passgate delay element 830a is coupled a second pull-down signal sub-line 225b and a second inverter delay element 810b. The output of the first passgate delay element 830a is received by an inverter 815 of the second inverter delay element 810b.

The output of the inverter 815 of the second inverter delay element 810b is coupled to a NOR gate 820 of the second inverter delay element 810b. The output of the NOR gate 820 of the second inverter delay element 810b is the output of the second inverter delay element 810b.

The output of the second inverter delay element 810b is coupled to a third pull-down signal sub-line 225c and an input of a second passgate delay element 830b. The output of the second passgate delay element 830b is coupled to a fourth pull-down signal sub-line 225d and to the NAND/NOR delay element 825. The NAND/NOR delay element is coupled to a fifth pull-down signal sub-line 225e.

The switch circuit 720 of the pull-down subsystem 210 includes an inverter 815, turn-off transistors 817a–817d, a passgate delay element 835, and a sixth pull-down signal sub-line 225f. The inverter 815 of the switch circuit and the sixth pull-down signal sub-line 225f. The passgate delay element 835 of the switch circuit 720 is coupled to the second pull-down signal sub-line of the stagger circuit 225b. In addition, the first turn-off transistor 817a of the switch circuit 720 is also coupled to the second pull-down signal sub-line 225b, as well as the second turn-off transistor 817b, the third turn-off transistor 817c, and the fourth turn-off transistor 817d.

The second turn-off transistor 817b is coupled to the passgate delay element 835 of the switch circuit 720, the third and the fourth turn-off transistors 817c, 817d, and the sixth pull-down signal sub-line 225f. The third turn-off transistor 817c is also coupled to the sixth pull-down signal sub-line 225f. The first, the second, the third, and the fourth turn-off transistors 817a–817d are coupled to the fourth pull-down signal sub-line 225d.

The stagger circuit 710 and the switch circuit 720 of the pull-down subsystem 210 generate staggered pull-down signals along the pull-down signal sub-lines 225a–225f when the output signal along the output signal line 130 is a logic low. It is noted that the group of pull-down signal sub-lines 225a–225f are all coupled to the output driver 215 and may be represented as the pull-down signal line 225 in FIGS. 2 and 7. The switch circuit 720 allows for the rapid turn-off of the stagger circuit 710 so that the pull-down subsystem 210 is completely off when the pull-up subsystem 205 is operational.

Figure 9:
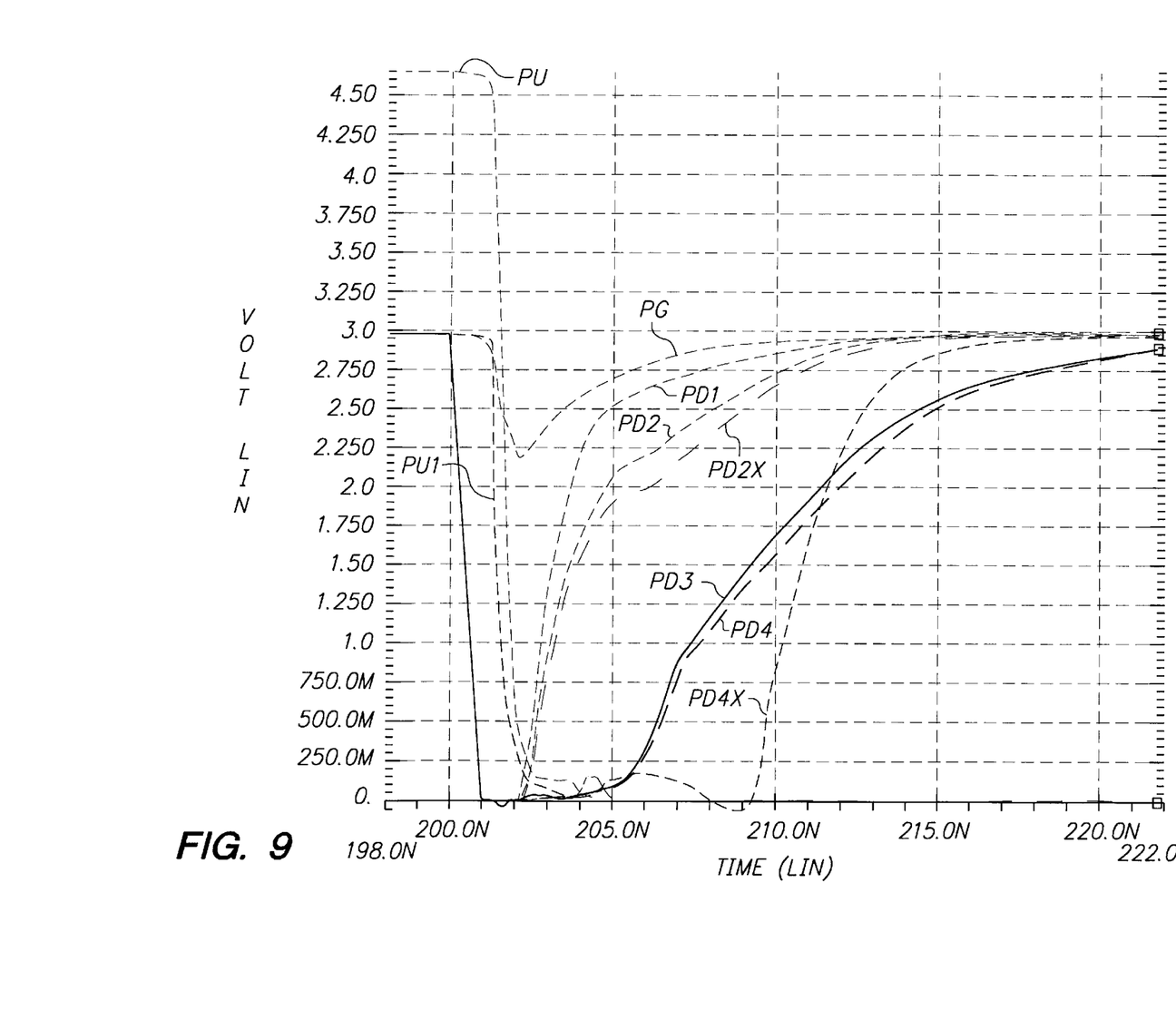
FIG. 9 is a timing diagram for pull-down signals from the pull-down subsystem of the I/O buffer in accordance with the present invention.

FIG. 9 illustrates a timing diagram for the pull-down signals along the pull-down signal sub-lines 225a–225f in the pull-down subsystem 210 of the I/O buffer 110 in accordance with the present invention. The signals along the pull-down signal lines 225a–225f all start at 0 volts and rapidly approach and level out at approximately 3.0 volts. The first pull-down signal to approach 3.0 volts is the pull-down signal along the first pull-down signal sub-line 225a, followed by the pull-down signals along the second pull-down signal sub-line 225b, the sixth pull-down signal sub-line 225f, the third pull-down signal sub-line 225c, the fourth pull-down signal sub-line 225d, and the fifth pull-down signal sub-line 225e.

One advantage of this approach is to obtain a staggered output along the pad signal line 225 so that the noise on the microchip is reduced while maintaining the microchip speed. It is noted that the pull-up signal drops to approximately 0 volts because the pull-up subsystem 205 and the pull-down subsystem 210 do not operate simultaneously.

The pull-down subsystem 210 provides staggered pull-down signals that substantially approach a power supply voltage level while having a low noise signal level. Moreover, the low noise pull-down signal is used to advantageously generate a pad signal having even less noise to drive a peripheral device and, therefore, beneficially increase overall system performance.

Figure 10:
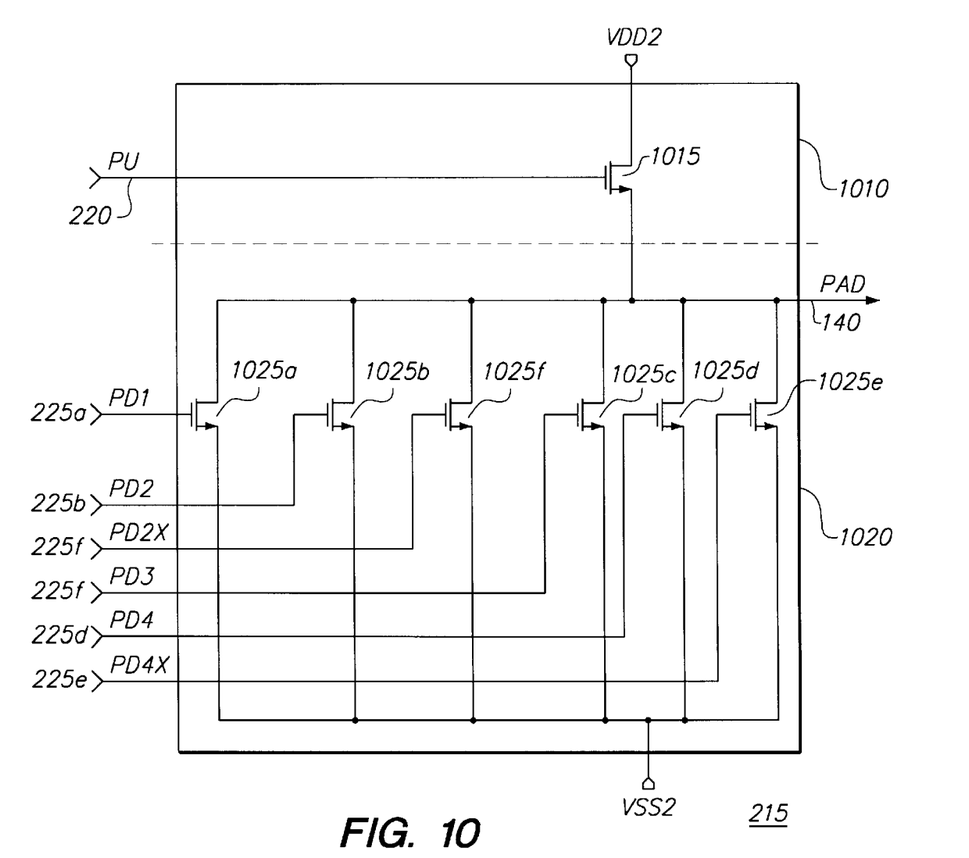
FIG. 10 is a circuit diagram of an output driver in accordance with the present invention.

FIG. 10 is a circuit diagram of the output driver 215 in accordance with the present invention. The output driver 215 includes a pull-up circuit 1010 and a pull-down circuit 1020. The pull-up circuit 1010 may include one or more pull-up transistors 1015, each having a gate, a drain, and a source, that may be cascaded together. The pull-up signal line 130 from the pull-up subsystem 205 is coupled to the gate of the pull-up transistor 1015. The source of the pull-up transistor 1015 is coupled to the pad signal line 140.

The pull-up transistor 1015 pulls the pad, or output, signal upto the full rail output, which is the supply voltage on the microchip, for example 3.3 volts or 5.0 volts. Moreover, when the two or more pull-up transistors are cascaded together they may be cascaded in similar percentages to the pull-down circuit. The pad signal that is generated from the pull-up stagger subcircuit along the pad signal line 140 is a logic high signal having the advantage of significantly reduced or associated noise. In an alternative embodiment, if there are separate staggers on the pull-up portion, there must be a separate pull-up subsystem 205 for each stagger.

The pull-down circuit 1020 also includes one or more pull-down transistors 1025 (1025a–1025f), each having a gate, a drain, and a source, that may be cascaded together so that the pad signal could be staggered. In the embodiment shown, for example, a gate of each pull down transistor is tied to a respective pull-down signal sub-line 225a–225f from the pull-down subsystem 210. The drain of each pull-down transistor 1025a–1025f is coupled to the pad signal line 140.

The pull-down transistors 1025a–1025f of the pull-down circuit 1020 is staggered so that the pad signal output along the pad signal line 140 is also staggered. For example, the pull down transistors 1025a–1025f may be staggered as 10%, 10%, 10%, 10%, 10%, and 50%, respectively, or 5%, 10%, 15%, 20%, 25%, and 25%, respectively. Staggering the pull-down transistors 1025 staggers the pad signal along the pad signal line 140 and, thereby, generates low noise relative to the pad signal that drives the peripheral device such as a memory 120.

Figure 11:
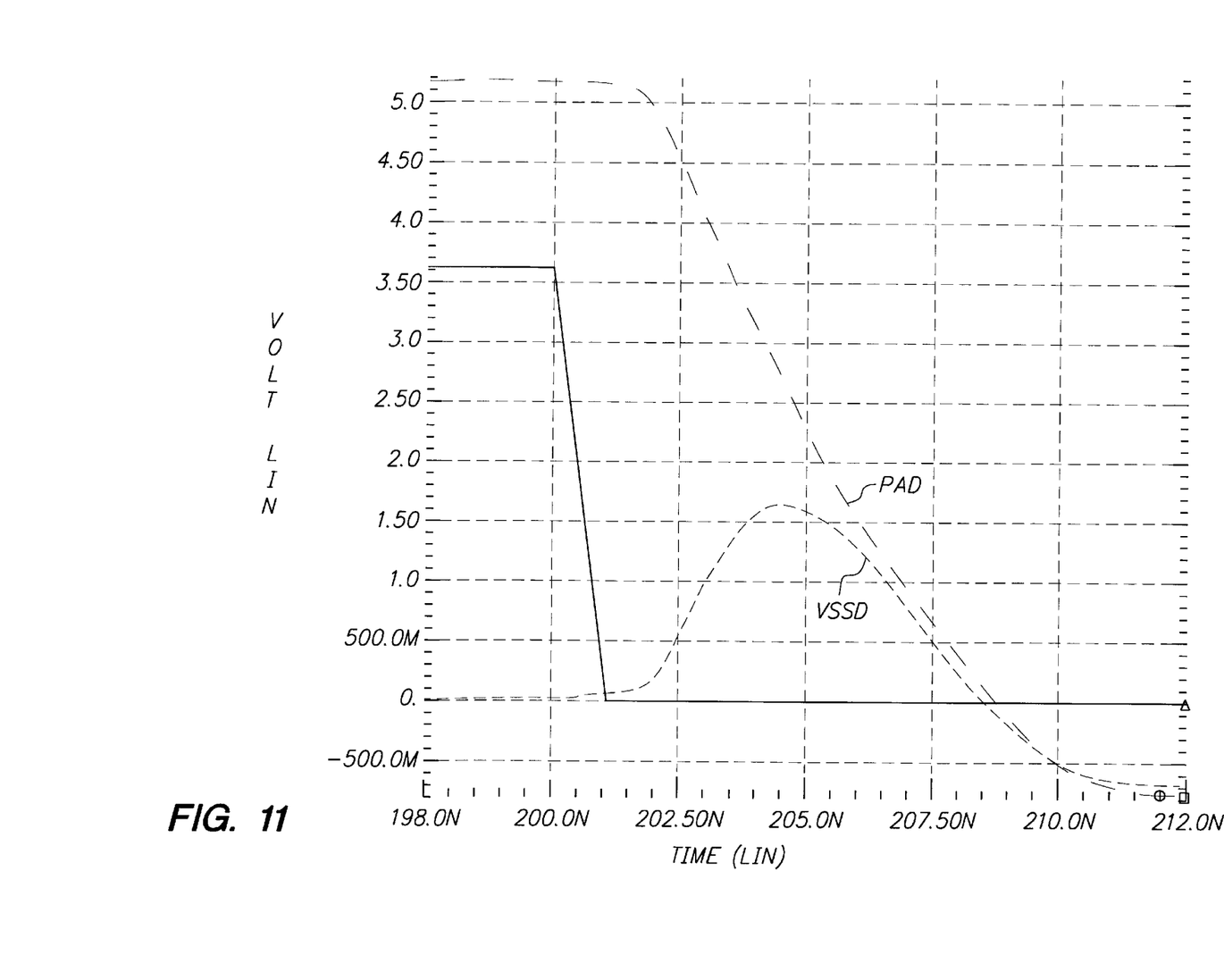
FIG. 11 is a timing diagram of ground noise of an signal output from the output driver in accordance with the present invention.

FIG. 11 is a timing diagram illustrating the noise associated with a pad signal along the pad signal line 140 that is used to drive a peripheral device. As the pad signal reaches the desired voltage level, for example 0 volts, the ground noise associated with the pad signal quickly dissipates to 0 volts. The low noise allows the mixed voltage drive system to have an increase in performance.

The I/O buffer 110 and method significantly increases system performance in a mixed voltage drive system environment. In particular, the I/O buffer 110 either pulls up or pulls down the pad signal it receives and then staggers the respective signal so as to produce a pulled-up signal or a pulled-down signal to drive a peripheral device, for example a memory 120. Thus, there is an increase in system speed due to low ground noise as time delays associated with waiting for noise to dissipate are reduced or eliminated.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. In a CMOS technology system, a driver system for a circuit, comprising:

an output driver having an output driver line, the output driver line coupled to the circuit; and an output predriver subsystem having a pull-up subsystem coupled to receive an output signal and an output enable signal for generating a pull-up signal and having a pull-down subsystem coupled to receive the output signal and the output enable signal for generating a pull-down signal, the output driver coupled to receive the pull-up signal and the pull-down signal and generate an output drive signal along the output driver line, wherein, the pull-up subsystem further comprises a multistage delay circuit, coupled to receive the output signal and the output enable signal. for generating a control signal;

a bootstrap circuit, coupled to the multistage delay circuit to receive the control signal, for generating the pull-up signal; and a current regulation circuit, coupled to the multistage delay circuit for limiting a current signal to prevent high current flow in the pull-up subsystem.

2. The driver system in claim 1, wherein the pull-up subsystem further comprises a turn-off circuit to turn off the pull-up subsystem.

3. The driver system in claim 2, wherein the pull-up subsystem further comprises:
  a keeper circuit, coupled to the bootstrap circuit, for maintaining a voltage level of the pull-up signal; and
  an oscillator circuit, coupled to the keeper circuit, for generating a periodic clock signal to drive the keeper circuit.

4. The driver system in claim 1, wherein the current regulation circuit comprises a latch-up subcircuit for generating a current regulated signal to prevent latch-up in the pull-up subsystem.

5. The driver system in claim 4, wherein the latch-up subcircuit comprises a startup subcircuit for starting operation of the latch-up subcircuit, the startup subcircuit coupled to the bootstrap subcircuit for providing a start voltage level to the bootstrap circuit.

6. The driver system in claim 5, wherein a damping subcircuit is coupled to the bootstrap circuit and the startup circuit for reducing noise within the latch-up subcircuit.

7. The driver system in claim 4, wherein the latch-up subcircuit further comprises a reliability clamp subcircuit, coupled to a damping resistor and a startup transistor, for providing reliability protection for the latch-up preservation signal.

8. The driver system in claim 5, wherein the startup subcircuit comprises an NMOS transistor having a gate and a drain, each tied to a power supply, and a source tied to the bootstrap circuit.

9. The driver system in claim 5, wherein the damping subcircuit comprises at least one resistor coupled to a MOS regulator transistor, the MOS regulator transistor being an n-channel transistor or a p-channel transistor.

10. The driver system in claim 1, wherein the bootstrap circuit further comprises:
  a precharge subcircuit for providing a current regulated signal to the bootstrap circuit to produce a first voltage level in the bootstrap circuit at a power supply level;
  a passgate, coupled to the precharge subcircuit, for transferring the first voltage level to the output driver line; and
  a delay subcircuit, coupled to the passgate, for producing a delay signal to drive the first voltage level above the power supply level.

11. The driver system in claim 10, wherein the delay subcircuit further comprises at least one delay element coupled to at least one capacitance element.

12. The driver system in claim 10, wherein the precharge subcircuit comprises a MOS device having a well and a source, the well coupled to the source, the multistage delay circuit coupled to the MOS device, the MOS device for providing the current regulated signal to the bootstrap circuit.

13. The driver system in claim 12 wherein the MOS device is a p-channel MOS device.

14. The drive system in claim 1, wherein the pull-down subsystem comprises:
  a stagger subsystem, coupled to receive the output signal and the output enable signal, for generating the pull-down signal; and
  a switch subsystem, coupled to receive the output signal and the output enable signal and coupled to the stagger subsystem, for generating a switch enable signal to enable a portion of the stagger subsystem.

15. The driver system in claim 14, wherein the stagger subsystem comprises a plurality of cascaded delay elements, each delay element coupled to the switch subsystem for enabling each delay element individually.

16. The driver system in claim 15, wherein at least one delay element of the plurality of cascaded delay elements comprises a passgate delay element.

17. The driver system in claim 15, wherein at least one delay element of the plurality of cascaded delay elements comprises an inverter delay element.

18. The driver system in claim 15, wherein at least one delay element of the plurality of cascaded delay elements comprises a NAND-NOR delay element.

19. The driver system in claim 15, wherein at least one delay element of the plurality of cascaded delay elements comprises a resistor delay element.

20. The driver system in claim 1, wherein the output driver comprises a pull-up circuit and a pull-down circuit, the pull-up circuit coupled to the pull-down circuit and coupled to receive the pull-up signal, the pull-down circuit coupled to receive the pull-down signal.

21. The driver system in claim 20, wherein the output driver comprises a staggered pull-down circuit.

22. The driver system in claim 21, wherein the staggered pull-down circuit comprises a plurality of cascaded pull-down transistors.

23. A method for generating a pad signal having low noise for driving a peripheral device comprising:
  receiving an output signal;
  generating a pull-up signal in response to the output signal being a logic high-signal level, generating the pull-up signal including the steps of generating a voltage maintenance signal for maintaining a voltage level of the pull-up signal and receiving an oscillator signal at an oscillator circuit for providing regular signals to a keeper circuit;
  generating a plurality of pull-down signals in response to the output signal being a logic low signal level;
  receiving the pull-up signal or the plurality of pull-down signals at an output driver; and
  staggering the plurality of pull-down signals in the output driver to generate the pad signal having low noise.

24. The method in claim 23, wherein generating the plurality of pull-down signals further comprises:
  staggering the received output signal at a staggering circuit to generate the at least one pull-down signal; and
  switching off the staggering circuit upon generating the at least one pull-down signal.

25. A mixed voltage drive system for generating a pad signal having a pull-up or a pull-down voltage level to drive a peripheral device, comprising:
  an output predriver having a pull-up subsystem and a pull-down subsystem, both the pull-up subsystem and the pull-down subsystem coupled to receive an output signal, the pull-up subsystem for generating a pull-up signal in response to the output signal being a logic high and the pull-down subsystem for generating a pull-down signal in response to the output signal being a logic low; and
  an output driver having a pull-up circuit and a pull-down circuit, the pull-up circuit coupled to receive the pull-up signal and the pull-down circuit coupled to receive the pull-down signal, the output driver for generating the pad signal that is pulled up in voltage level in response receiving the pull-up signal and for generating the pad signal that is pulled down in voltage level in response to receiving the pull-down signal;

wherein the pull-down subsystem includes a stagger circuit and a switch circuit, the stagger circuit for receiving the output signal and generating the pull-down signal and the switch circuit for rapidly turning off the stagger circuit once the pull-down signal is generated.

26. The mixed voltage drive system in claim 25, wherein the pull-up subsystem includes a multistage delay circuit and a bootstrap circuit, the multistage delay circuit coupled to the bootstrap circuit, the multistage delay circuit for receiving the output signal to generate a control signal from the received output signal for the bootstrap circuit and the bootstrap circuit for generating a pull-up signal.

27. The mixed voltage drive system in claim 26, wherein the pull-up circuit includes at least one pull-up transistor for receiving the pull-up signal and generating the pad signal that is pulled up in voltage level.

28. The mixed voltage drive system in claim 26, wherein the pull-down circuit includes at least one pull-down transistor for generating the pad signal that is pulled-up in voltage level.

29. A method for generating a pad signal having low noise for driving a peripheral device comprising:

receiving an output signal;

generating a pull-up signal in response to the output signal being a logic high-signal level;

generating a plurality of pull-down signals in response to the output signal being a logic low signal level, wherein generating the plurality of pull-down signals includes staggering the received output signal at a staggering circuit to generate the at least one pull-down signal and switching off the staggering circuit upon generating the at least one pull-down signal;

receiving the pull-up signal or the plurality of pull-down signals at an output driver; and staggering the plurality of pull-down signals in the output driver to generate the pad signal having low noise.

30. The method in claim 29, further comprising the steps of:

generating the pull-up signal including the steps of generating a voltage maintenance signal for maintaining a voltage level of the pull-up signal; and receiving an oscillator signal at an oscillator circuit for providing regular signals to a keeper circuit.

* * * * *